United States Patent
Evans

(12)
(10) Patent No.: US 6,274,437 B1
(45) Date of Patent: Aug. 14, 2001

(54) TRENCH GATED POWER DEVICE FABRICATION BY DOPING SIDE WALLS OF PARTIALLY FILLED TRENCH

(75) Inventor: Jonathan Leslie Evans, Herts (GB)

(73) Assignee: Totem Semiconductor Limited, Baldock (GB)

( * ) Notice: Subject to any disclaimer, the term of this patent is extended or adjusted under 35 U.S.C. 154(b) by 0 days.

(21) Appl. No.: 08/973,147

(22) PCT Filed: Jun. 14, 1996

(86) PCT No.: PCT/GB96/01445

§ 371 Date: Jan. 27, 1998

§ 102(e) Date: Jan. 27, 1998

(87) PCT Pub. No.: WO97/00536

PCT Pub. Date: Jan. 3, 1997

(30) Foreign Application Priority Data

Jun. 14, 1995 (GB) .................................. 9512089

(51) Int. Cl.⁷ ........................ H01L 21/336; H01L 29/76
(52) U.S. Cl. ..................... 438/272; 438/524; 438/700; 257/330
(58) Field of Search ..................... 438/675, 137, 438/138, 156, 173, 192, 206, 212, 268, 514, 523, 524, 525, 700, FOR 176, FOR 192, 272, 239, 209, 315, 270; 257/329, 330, 333

(56) References Cited

U.S. PATENT DOCUMENTS

| | | | |
|---|---|---|---|
| 3,908,262 | * | 9/1975 | Stein .................................. 29/579 |
| 4,140,558 | * | 2/1979 | Murphy et al. ..................... 148/175 |
| 4,415,371 | * | 11/1983 | Soclof ................................ 148/1.5 |
| 4,698,104 | * | 10/1987 | Barker et al. ...................... 438/141 |
| 4,756,793 | * | 7/1988 | Peek ................................... 156/640 |
| 4,824,793 | * | 4/1989 | Richardson et al. ................ 438/242 |
| 4,861,729 | * | 8/1989 | Fuse et al. ........................... 438/18 |

(List continued on next page.)

FOREIGN PATENT DOCUMENTS

| | | |
|---|---|---|
| 0 221 593 | 5/1987 | (EP) . |
| 0 234 244 | 9/1987 | (EP) . |
| 2 647 596 | 11/1990 | (FR) . |
| 2 264 388 | 8/1993 | (GB) . |
| 1-108762 | 4/1989 | (JP) . |
| 4-10640 | 1/1992 | (JP) . |

OTHER PUBLICATIONS

Silicon Processing for the VLSI Era vol. 1—Process Technology, pp 280–282, "Ion Implantation for VLSI", 1986.*
Derwent abstract of EP–A–0234244 (1 page).
Patent Abstracts of Japan, vol. 012, No. 168 (E–611), May 20, 1988, & JP 62–279666 (Matsushita Electric Ind Co Ltd), Dec. 4, 1987; Figs. 1, 2.
Patent Abstracts of Japan, vol. 013, No. 348 (E–799), Aug. 4, 1989, & JP A 01 108762 (Matsushita Electric Ind Co Ltd), Apr. 26, 1989; Figs. 1, 2.
Applied Physics Letters, vol. 54, No. 16, Apr. 17, 1989, pp. 1534–1536, XP000/32138, Fuse et al: "Indirect Trench Sidewall Doping by Implantation of Reflected Ions"; Fig. 1.

* cited by examiner

Primary Examiner—Olik Chaudhuri
Assistant Examiner—Kurt Eaton
(74) Attorney, Agent, or Firm—Blank Rome Comisky & McCauley LLP

(57) ABSTRACT

A trench is formed in a semiconductor substrate using a mask. The trench is filled with electrode material, a part of which is removed; alternatively, the trench is partially filled with the electrode material. The side walls of the trench are doped with the mask still in place. After the side walls are doped, the remainder of the trench is filled. The result is a trench gated power device such as a MOSFET, MESFET or IGBT.

10 Claims, 5 Drawing Sheets

U.S. PATENT DOCUMENTS

| | | | |
|---|---|---|---|
| 5,086,007 | 2/1992 | Ueno . | |
| 5,100,823 | * 3/1992 | Yamada | 438/243 |
| 5,108,938 | * 4/1992 | Solomon | 438/212 |
| 5,283,201 | * 2/1994 | Tsang et al. | 438/138 |
| 5,298,780 | * 3/1994 | Harada | 257/330 |
| 5,360,766 | * 11/1994 | Ko et al. | 438/192 |
| 5,376,575 | * 12/1994 | Kim et al. | 438/239 |
| 5,391,506 | * 2/1995 | Tada et al. | 438/268 |
| 5,502,320 | * 3/1996 | Yamada | 257/302 |
| 5,583,075 | * 12/1996 | Ohzu et al. | 438/212 |
| 4,939,104 | * 7/1990 | Pollack et al. | 438/561 |
| 5,034,341 | * 7/1991 | Itoh | 438/242 |

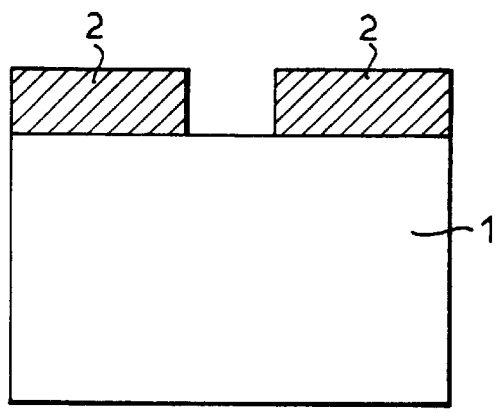
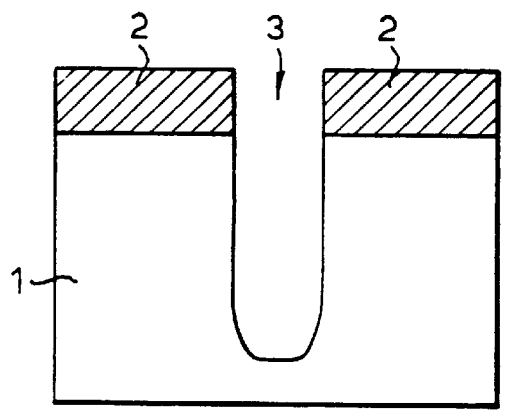
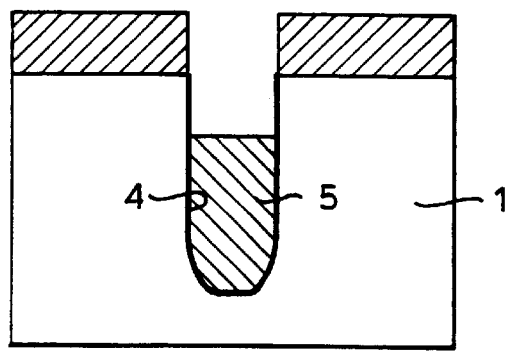
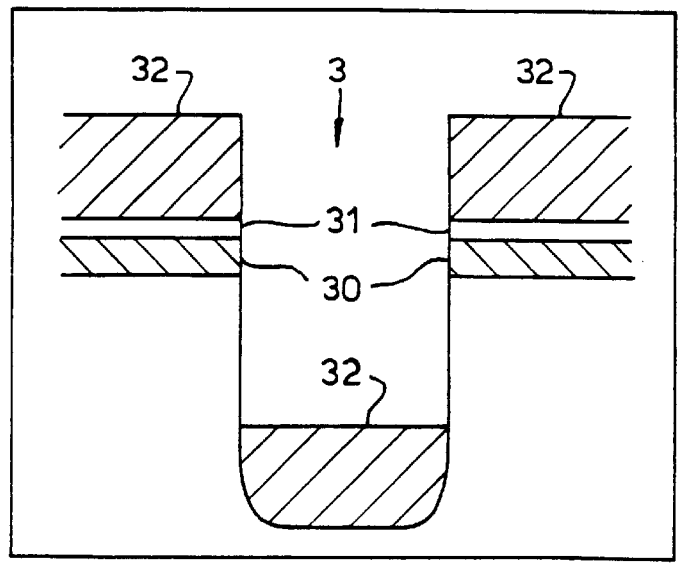

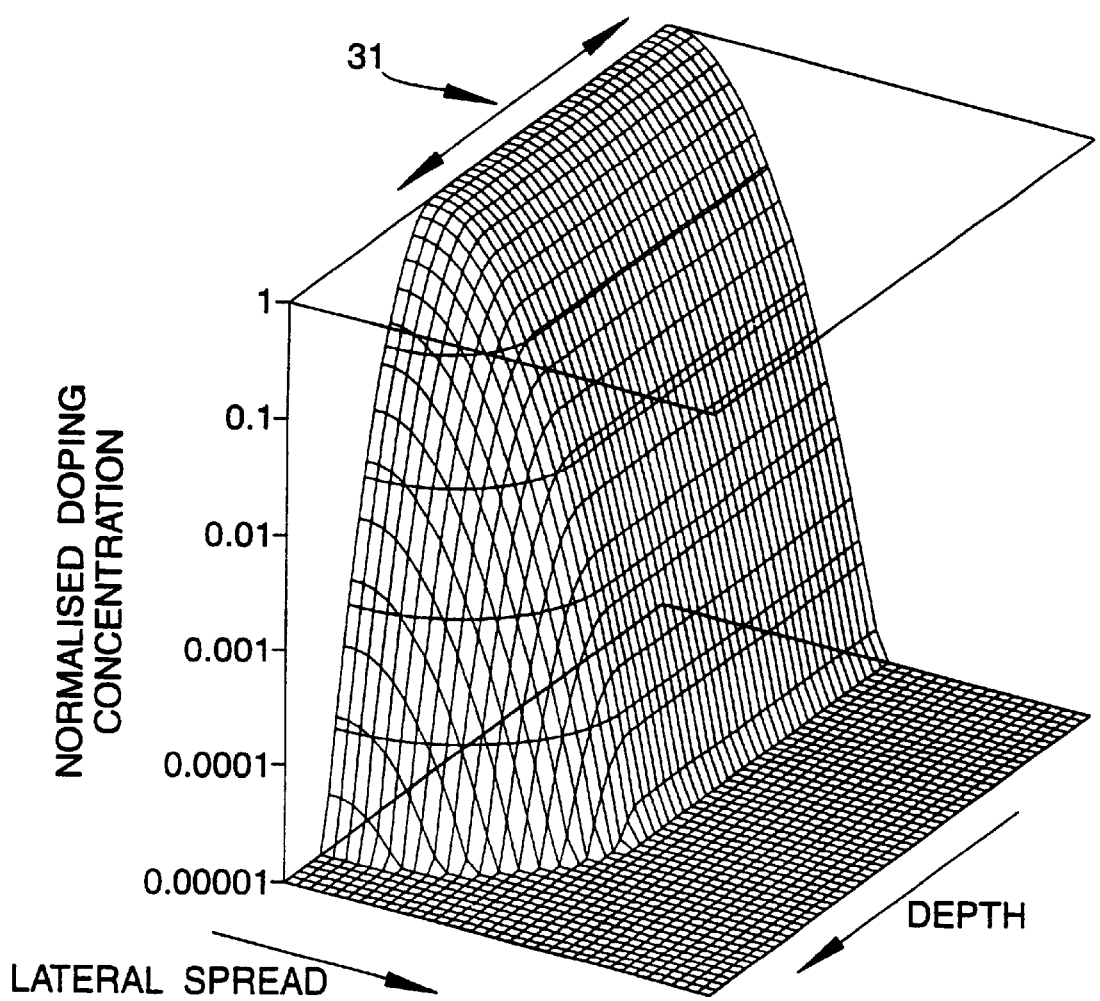

TRENCH GATED POWER DEVICE FABRICATION BY DOPING SIDE WALLS OF PARTIALLY FILLED TRENCH

FIELD OF THE INVENTION

The present invention relates to a method of forming a doped trench as part of the fabrication of a semiconductor device.

DESCRIPTION OF RELATED ART

A first conventional method of forming a doped trench is to implant a semiconductor with a suitable dopant and then etching through the implanted region to leave a trench with two side lobes. This method results in a doping profile as shown in the graph of FIG. 13. It can be seen from FIG. 13 that this doping method is characterised by a gradual drop off in concentration in both directions. This method has the disadvantage that the bottom of the doped region generally will not align with the electrode material which is added to the trench at a later stage.

U.S. Pat. 4,415,371 describes a second conventional method of fabricating a sub-micron dimension NPN lateral transistor. An array of hundreds of devices may be simultaneously processed on a chip to sub-micron dimensions by establishing tiny active regions for each transistor surrounded by field oxide field trenches which are utilized to dope the substrate within the action region. n+ regions are implanted in the trench by ion implanting at a large angle. The angle of the ion beams relative to the trench direction ensures that the n+ implanting does not extend to the full depth of the trench. This is due to a shadowing effect.

A disadvantage of this device is that the large ion implanting angle (which is necessary to ensure that the trenches are not fully doped) is non-standard and expensive, and also ionic reflections will reduce the effectiveness of the shadowing. Also the doped region will generally not align with the top of the electrode material which is deposited at a later stage.

SUMMARY OF THE INVENTION

In accordance with the present invention we provide a method of forming a doped trench as part of the fabrication of a semiconductor device, the method comprising:

(i) forming a trench in a semiconductor substrate using a mask to define the trench region;

(ii) either
   a) filling the trench and removing part of the contents of the trench to leave a partially filled trench; or
   b) partially filling the trench; and (iii) doping the side walls of the trench with the mask still in place.

The trench may be filled in step (ii) with any suitable material, depending on the particular type of semiconductor device being fabricated. Typically the trench is filled with a suitable electrode material or combination of materials as in a silicided gate.

The trench may be fully or partially filled with electrode material in step (ii) a), and then removed down to a desired level in the trench eg. by etching. Alternatively the trench may be partially filled in one step (ii) b) up to the desired level. In this case the trench is typically partially filled by evaporation of eg. aluminium.

The lateral spread of the doping profile can be accurately controlled and can be made to be very narrow. This is highly advantageous where trenches must be placed adjacent and as close as possible to one another and allows a particularly high device density. Conventional transistor arrays exhibit a device density of the order of 4 million devices per square inch. The present invention can be utilised to form a transistor array with approximately 400 million devices per square inch.

Device parameters such as the particular electrode material used and the dopant ions/atoms will depend on the particular device being fabricated. Typically the electrode is polysilicon or any refractory metal. Typically the dopant atoms are arsenic, phosphorous, boron or antimony for silicon, but other elements will be used for other substrate materials.

Preferably the trench is partially filled before the doping step. This ensures that the bottom of the doping profile is self-aligned to the top of the trench filling material (trench refill). Where the trench refill acts as an electrode in the final device, this will help to minimise the capacitance between this electrode and the doping region, and ensures channel continuity in a MOS gated device.

Where the gate is principally polysilicon, the doping step (iii) will also dope the polysilicon. This will enhance the electrode conductivity and therefore its switching speed.

Typically (as in a MOSFET but not in a device such as a MESFET) a dielectric (such as silicon dioxide) will be formed on the surface of the trench between steps (i) and (ii). After step (ii) the dielectric at the upper part of the trench will be exposed. The doping step may then be carried out by penetrating through this layer or alternatively, the exposed dielectric material may be removed beforehand.

Typically, the doping step (iii) comprises introducing dopant ions from an angled ionic source. This can result in very high surface dopant concentrations. This allows very low sheet resistivity regions to be formed. Further, the use of ion implantation means that a rapid thermal anneal can be used which will mean that if the semiconductor device is a power device which is used in a smart power device (where there are other impurity profiles in logic circuits) then this process will be more suitable as it will not affect the previous processing.

The angled implanting step may be carried out with a low angle of implant. This generally means that more than one implanting step could be required to dope all sides of the trench. Alternatively the angle of the ionic source to the surface of the substrate may be increased. The resulting ionic reflections from the side walls of the trench then causes substantially all sides of the trench to be at least partially doped and generally only one implanting step could be required.

Alternatively, the doping step (iii) may comprise diffusing dopant ions into the sidewalls of the trench from a dopant gas such as arsenic, phosphorous, boron, antimony or any other suitable dopant gas.

Further alternatives for the doping step (iii) include deposition of a dopant source such as heavily doped glass; and filling the exposed part of the trench with spin on dopant. Where the dopant mechanism is from a dielectric source (such as spin on glass or doped silicon dioxide), the material can be conveniently etched back to planarise the trench.

The resulting doped trench can then be utilised in the production of a wide variety of semiconductor devices. Examples of such devices are a trench gated power device such as a power MOSFET, MESFET or a power IGBT, a logic transistor or a memory cell.

The mask which is used to define the trench etch is also used to define the doping area in step (iii). This allows the doping step to be carried out by a variety of techniques such as ion implantation or gaseous diffusion, and any choice of doping (impurity) atoms. A further advantage of using the mask in both steps is that in the field areas (i.e. areas that do not have n+ source regions and where the gate contact will be made) this mask is desirable as it reduces the gate capacitance.

The present invention also extends to a device which has been constructed according to the previously described method. The device typically includes doped regions of the side walls of the trench which have a doping concentration which is substantially uniform in the exposed part of the trench (i.e. the part which is not masked by electrode material after step (ii)). The doped region also typically has a well defined drop-off in concentration at the top of the electrode material.

BRIEF DESCRIPTION OF THE DRAWINGS

A number of embodiments of the invention will now be described with reference to the accompanying figures, in which:

FIG. 1 is a cross-section of a masked substrate prepared for trench etch;

FIG. 2 is a cross-section of the masked substrate of FIG. 1 after trench etching;

FIG. 3 is a cross-section of the device of FIG. 2 after trench refill, etch back and oxidation;

FIG. 3A is a cross-section illustrating an alternative method of partially filling the trench;

DETAILED DESCRIPTION OF THE PREFERRED EMBODIMENTS

Figure 4:
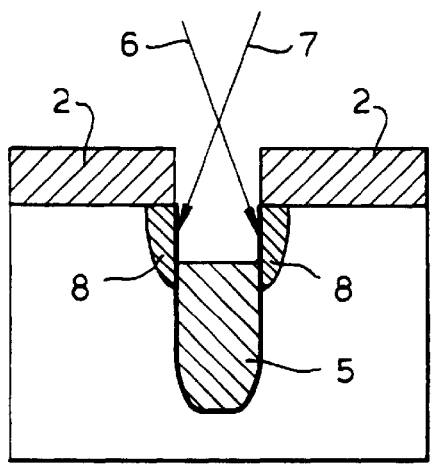
FIG. 4 is a cross-section of a first doping technique comprising angled implant directly through a thin surface layer.

Three stages in the doping preparation process are shown in FIGS. 1–3. Starting with a substrate 1 (typically silicon), a mask 2 is used to define areas where trenches will be formed (FIG. 1). Depending on the trench etch chemistry, the mask 2 could be composed of one of a number of materials such as photoresist, silicon dioxide or silicon nitride.

The trench 3 (FIG. 2) is then etched into the substrate 1 to a depth relevant to the device design. The trench can be etched using a plasma, ion beam, wet, or similar etch technique.

Once the trench has been etched, the next processing steps are dictated by the particular device itself. The doping technique described is applicable to a number of devices, mainly transistors, and it is therefore likely that the next step would be a gate oxidation of the surface of the trench to leave a layer of oxide 4 (FIG. 3), followed by the deposition of some kind of gate material 5, e.g. polysilicon, or any refractory metal.

This deposition may then be followed by an etch stage to leave the trench in the half filled state shown in FIG. 3. Alternatively the trench may be partially filled in one step as illustrated in FIG. 3A, and described below:

(i) The trench 3 is formed as described above but uses a 2 layer mask of silicon nitride 30 and silicon dioxide 31 ($SiO_2$).

(ii) Aluminium 32 is then evaporated into the sample and falls much like snow—giving a "line of sight" covering i.e. not conformal.

(iii) When the sample is placed in a wet solution capable of removing the $SiO_2$, the $SiO_2$ layer 31 is removed, along with all of the aluminium on the top of it. This is generally known as a "lift off" process. The nitride layer (still necessary as a doping mask) is left along with the aluminium at the bottom of the trench.

Typically the gate oxide is created by placing the substrate in a furnace with an atmosphere of oxygen, sometimes mixed with steam, nitrogen or hydrogen chloride. The furnace is typically operated at a temperature of 1000 degrees centigrade and cleanliness is a priority as any contaminants can ruin the electrical properties of the oxide.

This is termed "thermal oxidation" and is the standard technique for creating oxides with good electrical properties (ie. gate dielectrics and not passivation layers such as at the top of the trench). Oxides for other purposes ie. coating and insulating are generally deposited and therefore have poorer electrical properties. The dry method of thermally oxidising yields a better oxide (necessary for the accurate control of turn on voltages and reliability) but is a slower process than wet oxidising (ie. using an atmosphere of oxygen and steam).

Depending on the method of doping taken, this may complete the preparation for the doping step. If the first doping method is used (FIG. 4) no further action need take place. However, all of the other processes will be much more effective if the substrate is exposed, probably with an etch process to remove the exposed portion of the oxide layer 4 (ie. above the top of the electrode 5).

The particular doping method chosen will depend on the device type and its specifications.

Six possible doping methods will now be described with reference to FIGS. 4 to 9.

Referring to the first doping method shown in FIG. 4, the lateral doped regions 8 can be implanted directly through the oxide (or other thin layers) into the trench walls by dopant ions 6,7 from an angled, isotropic or divergent source. This has the advantage of having a very narrow lateral spread and removes the need to etch the trench sidewall. However, it is likely that at least two implants will be needed, one for each side of the trench (at the two angles illustrated by ion beams 6 and 7).

Figure 5:
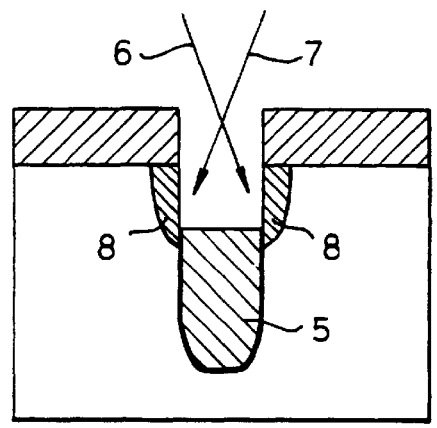
FIG. 5 is a cross-section of a second doping technique comprising angled implant directly into the trench wall.

In the second doping method shown in FIG. 5, an angled implant 6,7 is again used to inject dopant directly into the trench wall. However, in this case the oxide layer 4 has been removed with an etch (ie. the oxide in the exposed region above the electrode 5 has been removed). As a result lateral profile spreading is much easier to control and predict.

If a large angle implant is used (as illustrated by the ion beams 9 in FIG. 6), it is possible to take advantage of ionic reflections 10 to dope both sides of the trench in one step. This has the advantage of reducing the number of implant steps, but has the following disadvantages;

1) doping profiles will probably not be symmetric and, 2) large angle implants are not industry standard and will incur added expense.

Profile matching can be optimized by adjusting the mask layer thickness and the implant angle. The dopant ions could be arsenic, phosphorous, boron or antimony. The substrate crystal orientation will also have an effect on the ionic reflections.

Figure 6:
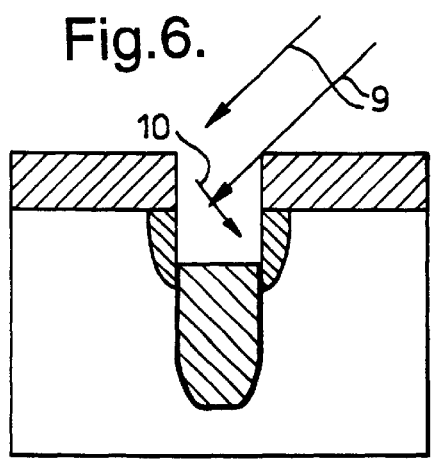
FIG. 6 is a cross-section of a third doping technique with large angle implant.

After the doping steps shown in FIGS. 4–6, a rapid anneal is carried out.

Figure 7:
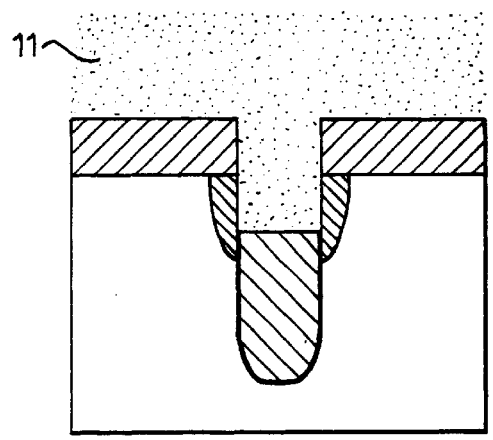
FIG. 7 is a cross-section of a fourth doping technique using a diffusion process.

Dopant atoms can be diffused into the trench sidewalls from a carrier gas 11 such as Arsine, Diborane or Phosphine (FIG. 7). This has the advantage of being a cheap process but may exhibit lower surface concentrations than implanted profiles, with a consequently lower conductance of the doped regions. The diffusion process is carried out at approximately 1000 degrees centigrade and therefore no separate annealing step is necessary.

Figure 8:
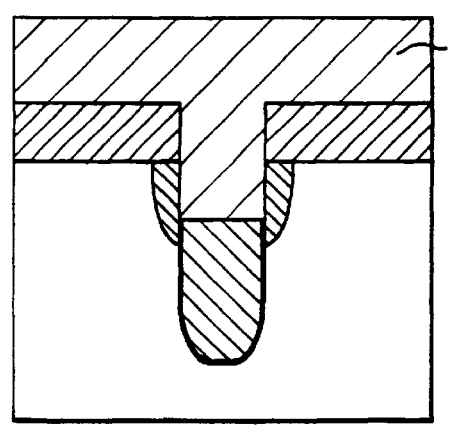
FIG. 8 is a cross-section of a fifth doping technique using a solid dopant source.

The deposition of a dopant source 12 (such as a heavily doped glass e.g. BPSG or PSG or oxide doped with phosphorous or arsenic) allows the easy diffusion of the dopant into the trench sidewalls (FIG. 8). This has the advantage of being cheap and also the dopant source may be etched back to planarise the trench. Doping is followed by a rapid thermal anneal.

Figure 9:
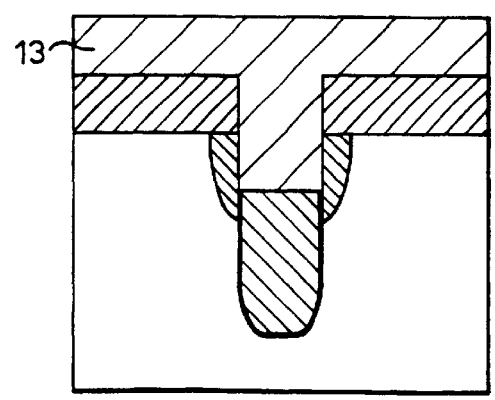
FIG. 9 is a cross-section of a sixth doping technique using spin-on dopant.

Alternatively, a spin on dopant 13 (such as glass doped with arsenic) can be used (FIG. 9). This has the advantage of not only providing a good source of dopant, but also is an excellent method of planarizing the trench which will be necessary in many applications. The doping step is followed by an anneal. This method automatically fills the trench with oxide.

FIGS. 1–9 have illustrated a number of initial steps in the fabrication of a device. The method of finishing the device will depend entirely on the application. Two possible areas of application are discussed below with reference to FIGS. 10–12.

Trench Gated Power Devices

These are vertical devices which are all connected in parallel to allow large current conduction. Such devices can be capable of withstanding thousands of volts and conducting hundreds of amps. Examples of such devices are power MOSFETs (Metal Oxide Semiconductor Field Effect Transistors), MESFETs (Metal Semiconductor Field Effect Transistors) and IGBTs (Insulated Gate Bipolar Transistors.

Figure 10:
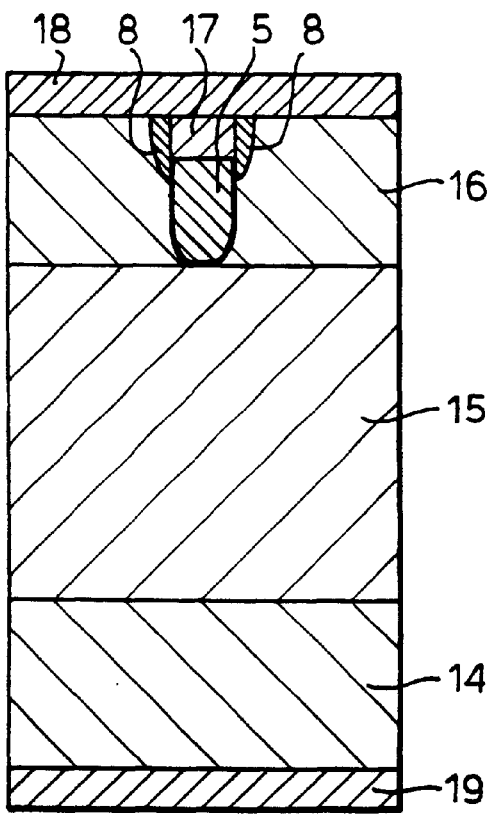
FIG. 10 is a cross-section of a power MOSFET device constructed according to the invention.
Figure 11:
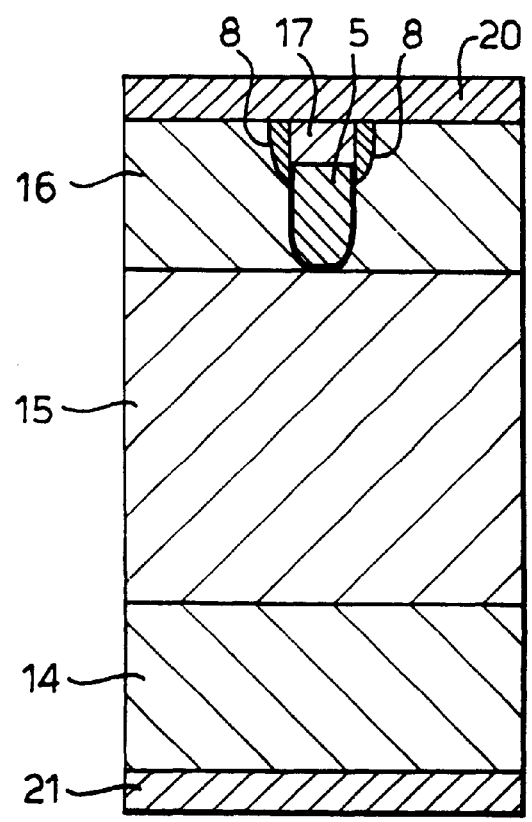
FIG. 11 is a cross-section of a power IGBT device constructed according to the invention.

Two examples are shown in FIGS. 10 and 11. FIG. 10 shows a power MOSFET device and FIG. 11 shows a power IGBT. Both trenches are formed on a substrate with a heavily doped lower layer 14, (n+++ in the case of the MOSFET and p+++ in the case of the IGBT), with an n– drain drift region 15 and a p base region 16. The doped lateral regions 8 are n++ source regions. In the case of the power MOSFET (FIG. 10) the trench is filled with an oxide 17, the electrode 18 acts as a source, electrode 19 acts as a drain and the trench electrode 5 acts as a gate. In the case of the IGBT (FIG. 11), the upper electrode 20 acts an emitter and the lower electrode 21 acts as a collector. In both cases, the polysilicon layer 5 acts as a gate.

Logic Transistors and Memory Cells

Figure 12:
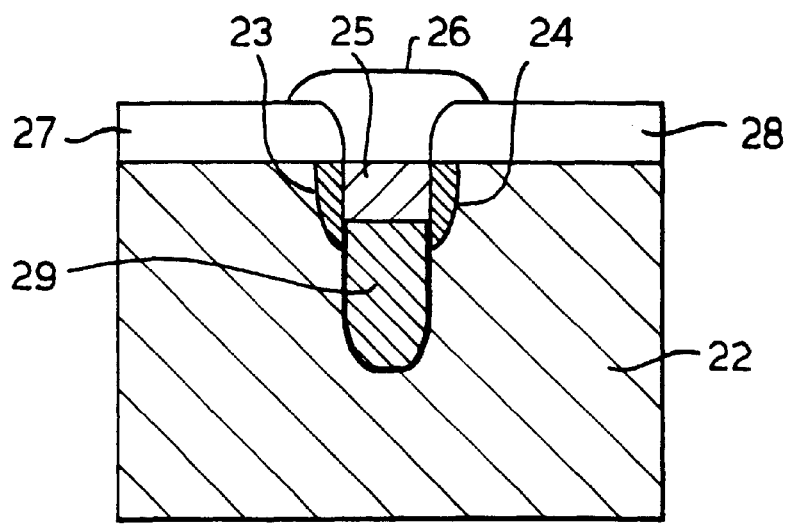
FIG. 12 is a cross-section of a logic transistor or memory cell constructed according to the invention.

FIG. 12 illustrates a logic transistor or memory cell which has been formed from the trench device previously described in FIGS. 1 to 9. The trench is formed in a substrate comprising a p base region 22. The laterally doped regions 23,24 are n+ regions. An oxide layer 25 is formed in the upper region of the trench. A passivation layer 26 is formed above the oxide layer. Source 27 and drain 28 electrodes are also provided. Trench electrode 29 acts as a gate.

For better operation, the trench in this device may well penetrate into a highly conductive epitaxial layer.

All of the above devices can have the p regions swapped for n, and vice-versa for different operating characteristics.

Figure 13:
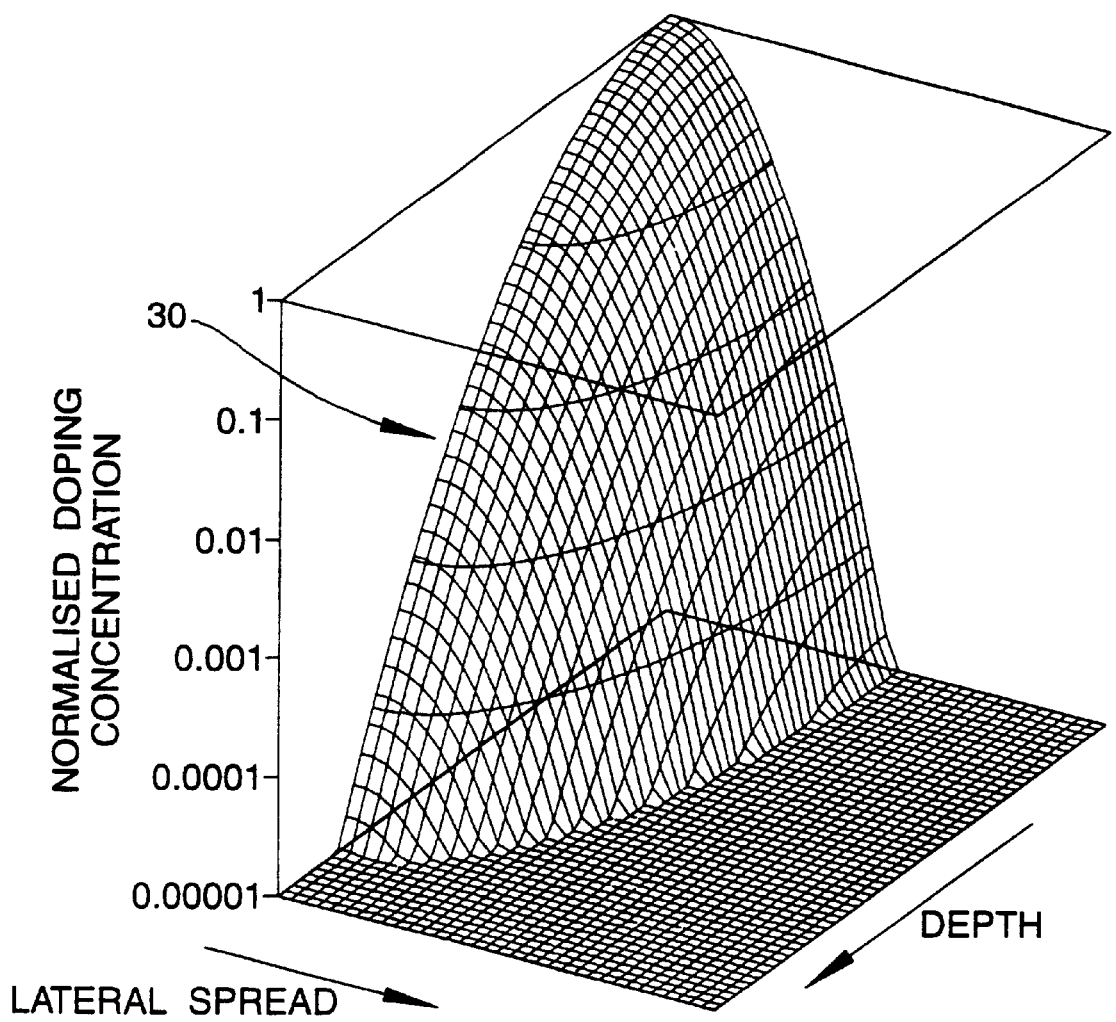
FIG. 13 is a graph illustrating the doping profile for a conventional non-lateral doped region; and, FIG. 14 is a graph illustrating the doping profile of a laterally doped region according to the present invention.

FIG. 13 illustrates the gradual drop off in doping concentration exhibited by a vertical implant (i.e. the first conventional method discussed earlier). Note the gradual vertical drop off in concentration, indicated at 30.

FIG. 14 illustrates the more uniform doping concentration in the exposed area of the trench during the implant of the present invention. Note that the trench surface concentration, indicated at 31, is uniform, unlike in a conventionally doped region illustrated in FIG. 13. The shadowing technique (i.e. the second conventional technique described earlier) may yield a similar profile, although there would be a significant amount of dopant material in areas which would be masked off (particularly by the material 5) during the implant of the present invention.

What is claimed is:

1. A method of fabricating a trench gated power device, the method comprising:
   (i) forming a trench in a semiconductor substrate using a mask to define the trench region;
   (ii) either
      a) filling the trench with electrode material and removing part of the contents of the trench to leave a partially filled trench; or
      b) partially filling the trench with electrode material;
   (iii) doping the side walls of the partially filled trench with the mask still in place; and
   (iv) filling the remainder of the trench after step (iii);
   wherein the trench gated power device is one selected from the group consisting of a MOSFET, MESFET and IGBT.

2. A method according to claim 1 further comprising forming a layer of dielectric on the surface of the trench between steps (i) and (ii).

3. A method according to claim 2, wherein step (iii) is carried out through the dielectric layer.

4. A method according to claim 2, further comprising removing the layer of dielectric from the exposed part of the trench after step (ii).

5. A method according to claim 1, wherein step (iii) comprises implanting dopant ions from an angled ionic source.

6. A method according to claim 5, wherein the angle of the ionic source to the surface of the substrate is large enough such that ionic reflections from the side walls of the trench causes substantially all sides of the trench to be at least partially doped in one implanting step.

7. A method according to claim 1, wherein step (iii) comprises diffusing dopant ions into the sidewalls of the trench from a dopant gas.

8. A method according to claim 1, wherein step (iii) comprises implanting dopant ions from an isotropic source.

9. A method according to claim 1, wherein step (iv) comprises filling the trench with oxide.

10. A method according to claim 1, wherein:
   the semiconductor substrate comprises:
      a doped lower layer selected from the group consisting of an n+++ doped
   lower layer and a p+++ doped lower layer;
      an n– drain drift region disposed on the doped lower layer; and
      a p base region disposed on the n– drain drift region; and
   step (i) comprises forming the trench in the p base region.

* * * * *